United States Patent [19]

Mar

[11] 3,727,076

[45] Apr. 10, 1973

[54] LOW POWER DIGITAL CIRCUIT UTILIZING AVALANCHE BREAKDOWN

[75] Inventor: Jerry Mar, Scotch Plains, N.J.

[73] Assignee: Bell Telephone Laboratories, Incorporated, Murray Hill, N.J.

[22] Filed: Dec. 30, 1971

[21] Appl. No.: 214,130

[52] U.S. Cl. ..................307/218, 307/232, 307/253, 307/285, 307/318

[51] Int. Cl. ..........................................H03k 19/22

[58] Field of Search......................307/218, 238, 280, 307/285, 253, 300, 318, 232

[56] References Cited

UNITED STATES PATENTS

| | | | |
|---|---|---|---|
| 3,050,640 | 8/1962 | Dillingham et al. | 307/280 X |
| 3,050,641 | 8/1962 | Walsh | 307/218 X |
| 2,866,105 | 12/1958 | Eckert, Jr. | 307/300 X |
| 3,299,290 | 1/1967 | Moll | 307/300 X |
| 3,349,252 | 10/1967 | Briley | 307/280 |
| 3,348,066 | 10/1967 | Briley | 307/280 X |
| 3,588,544 | 6/1971 | Wallingford | 307/280 X |

*Primary Examiner*—Stanley D. Miller, Jr.
*Attorney*—R. J. Guenther et al.

[57] ABSTRACT

A low power circuit utilized to perform logic and switch functions comprises a single junction transistor with a first diode connected in series with the base and a second diode connected in series with the collector. This circuit, which utilizes avalanche breakdown of both diodes, requires no DC voltages or overlapping pulses.

15 Claims, 10 Drawing Figures

LOW POWER DIGITAL CIRCUIT UTILIZING AVALANCHE BREAKDOWN

BACKGROUND OF THE INVENTION

This invention relates to very low powder semiconductor digital circuits having relatively simple structures which can be utilized as digital gates, switches or memory cells.

In many computer and other systems there exists the need for large information capacity semiconductor memories in which information can be temporarily stored and then retrieved within a useful period of time. This need is just starting to be met by the use of various low power, transient memory cells which have relatively simple structures that can be fabricated in a relatively small area of semiconductor material. An example of these new memory cells is the single transistor memory cell described in the publication Electronics of Mar. 1, 1971 in an article entitled "Bipolar Memory Cells Strike Back in War with MOS" and in the copending applications, Ser. Nos. 103,169 and 103,167 filed Dec. 31, 1970 by D. J. Lynes and J. Mar, respectively.

Presently memory peripherals, such as selection logic circuitry has been implemented utilizing TTL and DTL logic gates. These types of logic gates require DC voltages, overlapping pulses and 40 to 50 square mils of semiconductor area.

It would be desirable to have available transient logic gates and other switching circuits which require no DC voltages or overlapping pulses and can be fabricated utilizing standard integrated circuit techniques in a smaller area than that of standard TTL or DTL logic gates. In addition it would be desirable that such circuits have power dissipation of well under 10 milliwatts.

OBJECTS OF THE INVENTION

It is a primary object of this invention to provide a logic gate circuit and/or a switching circuit, which all operate without DC voltages or overlapping pulses and have relatively low power dissipation.

It is another object of this invention to provide a logic gate circuit and/or a switching circuit which meet the above-mentioned objective and have a relatively simple structure which can be fabricated using standard integrated circuit techniques in a relatively small area of a semiconductor substrate.

SUMMARY OF THE INVENTION

These and other objects of the invention are attained in an illustrative embodiment thereof comprising a junction transistor and a first diode in series with the base of the transistor and a second diode in series with the collector of the transistor. A terminal coupled to the cathode of the first diode serves as a reset terminal; a terminal coupled to the emitter of the transistor and a terminal coupled to the cathode of the second diode serve as two input terminals; and a terminal connected to the collector of the transistor serves as the output terminal. The anodes of the first and second diodes are coupled to the collector and base of the transistor, respectively.

The embodiment described above is operated as follows to obtain an AND gate type function: a reset voltage pulse is first applied to the reset terminal. This pulse causes the first diode to operate in avalanche breakdown which results in charge being inserted onto and stored in the collector-to-base junction capacitance of the transistor. The charge inserted is trapped because, at the end of the reset pulse, the second diode and the collector-to-base junction are both reverse biased making them appear as relatively high impedances to the charge on the collector-to-base capacitance. Within a period of time before the trapped charge is able to dissipate, a voltage pulse is applied to the first input terminal which causes the second diode to operate in avalanche breakdown, thereby allowing the charge trapped on the collector-to-base capacitance of the transistor to be dissipated. If a voltage pulse is now applied to the second input, a pulse of current through the transistor, which is monitored at the output terminal, will occur. If the first input pulse after the reset pulse is not applied to the first input terminal, then the application of the second input pulse will result in no conduction through the transistor. Since there is an output from the transistor only if both input terminals receive pulses, an AND type gate function is permitted.

The preferred embodiment of the invention comprises an NPN transistor and three diodes coupled by their cathodes to the collector-emitter and base of the transistor, respectively. The first terminal coupled to the anode of the first diode serves as a reset terminal; a second terminal coupled to the anode of the second diode serves as a first input terminal; a third terminal coupled to the anode of the third diode serves as the second input terminal; and a fourth terminal coupled to the emitter of the transistor serves as the output terminal.

The operation of the preferred embodiment is similar to that of the previously discussed embodiment. A reset pulse applied to the reset terminal causes the first diode to operate in avalanche breakdown and charge thereby inserted and trapped in the collector-to-base capacitance of the transistor. The main advantage of the preferred embodiment is that it is capable of maintaining the charge stored in the collector base capacitance for a significantly longer time than the previous embodiment. It is to be noted that in both of the above described embodiments there is no need for DC power sources or overlapping pulses.

As will become clear later, the above-described embodiments may be used as switches or as dynamic memory cells.

These and other objects, features and embodiments of the invention will be better understood from a consideration of the following detailed description taken in conjunction with the following drawings.

DETAILED DESCRIPTION

Figure 1A:
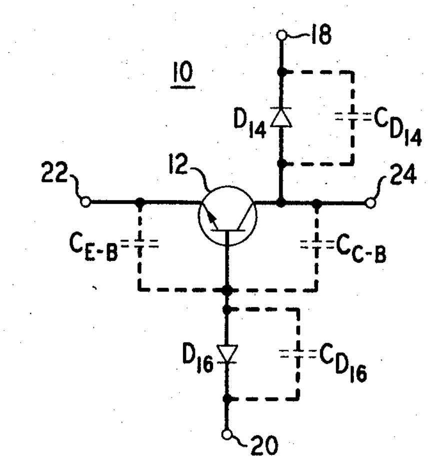
FIG. 1A illustrates one schematic embodiment of a digital circuit in accordance with the invention.

Referring to FIG. 1A, there is shown for illustrative purposes a circuit 10 which comprises an NPN junction transistor 12, a diode $D_{14}$ and a diode $D_{16}$. The anode of $D_{14}$ is coupled to the collector of transistor 12 and the and the anode of $D_{16}$ is coupled to the base of transistor 12. A first terminal 18 is coupled to the cathode of $D_{14}$ and a second terminal 20 is coupled to the cathode of $D_{16}$. A third terminal 22 is coupled to the emitter of transistor 12 and a fourth terminal 24 is coupled to the collector of transistor 12.

Dashed line capacitances $C_{D_{14}}$ and $C_{D_{16}}$ represent the parasitic capacitance associated with $D_{14}$ and $D_{16}$, respectively. Dashed line capacitances $C_{C\text{-}B}$ and $C_{E\text{-}B}$ represent the parasitic capacitances associated with the collector-base and emitter-base junctions of transistor 12, respectively. Typically, $C_{C\text{-}B}$ is from five to 10 picofarads and $C_{E\text{-}B}$, $C_{D_{14}}$ and $C_{D_{16}}$ are approximately 0.1 picofarads.

During all operations performed on circuit 10, terminals 18, 20 and 22 are either held at ground potential or pulsed to some positive or negative potential. This means that there is no need for any DC voltage sources.

In order to utilize circuit 10 to perform an AND gate type function, it is first necessary to apply a positive polarity reset voltage pulse to terminal 18. The amplitude of the reset voltage pulse is sufficient to cause diode 14 to operate temporarily in avalanche breakdown. This causes charge to be inserted into $C_{C\text{-}B}$ that becomes trapped at the termination of the reset voltage pulse due to the fact that the emitter-base junction of the transistor and diode 16 become reverse biased.

The reverse-biased junctions act as high impedance paths which, in effect, trap the charge previously inserted into $C_{C\text{-}B}$. The charge trapped on $C_{C\text{-}B}$ will eventually leak off $C_{C\text{-}B}$ through the reverse-biased junctions since they do not have infinitely high impedances. The charge does, however, remain trapped for a useful period of time. For this embodiment this period of time is typically 1 millisecond.

A positive polarity voltage pulse of sufficient amplitude to cause $D_{16}$ to temporarily operate in avalanche breakdown is applied within 1 millisecond of the termination of the reset pulse to terminal 20. This pulse allows $C_{C\text{-}B}$ to discharge thereby causing the emitter-base junction to go from a reverse-biased condition to one which is on the border line of being forward biased.

After the termination of the pulse applied to terminal 20 but within 1 millisecond of the termination of the reset pulse, a negative polarity voltage pulse is applied to terminal 22. This pulse causes the emitter-base junction of transistor 12 to be temporarily forward biased, thereby causing a pulse of current through transistor 12, which is monitored on terminal 24. If the negative polarity voltage pulse is applied to terminal 22 within 1 millisecond of the termination of the reset pulse, and there is no pulse applied to terminal 20 in the time interval between the termination of the reset pulse and the application of the pulse to terminal 22, the emitter-base junction of transistor 12 will not be forward biased and therefore there is no current pulse monitored on terminal 24.

It is to be noted that circuit 10, when operated as described above, performs an AND gate type function. If after a reset pulse is applied to terminal 18 and pulses are applied to terminals 20 and 22, there is a resulting pulse on terminal 24. If, however, a pulse is applied to just terminal 22 after the reset pulse is applied to terminal 18, there is no resulting pulse on terminal 24.

Circuit 10, when operated as described above, may also be considered a switch which is either closed or open and, as such, will either pass or not pass a negative voltage pulse applied to terminal 22 through the transistor to terminal 24. The pulse applied to terminal 18 can be considered a switch opening pulse and the pulse applied to terminal 20 can be considered a switch closing pulse.

In addition, the circuit of FIG. 1A when operated as described above, may be considered a dynamic memory cell. The pulse applied to terminal 18 may be considered the write-in of a "0" and the pulse applied to terminal 20 may be considered the write-in of a "1". The voltage pulse applied to terminal 22 may be considered a read pulse. The appearance or nonappearance of a pulse on terminal 24 upon the application of a pulse to terminal 28 is indicative of whether a "1" or a "0" is stored in the cell.

Figures 1B, 1C, 1D, 1E:
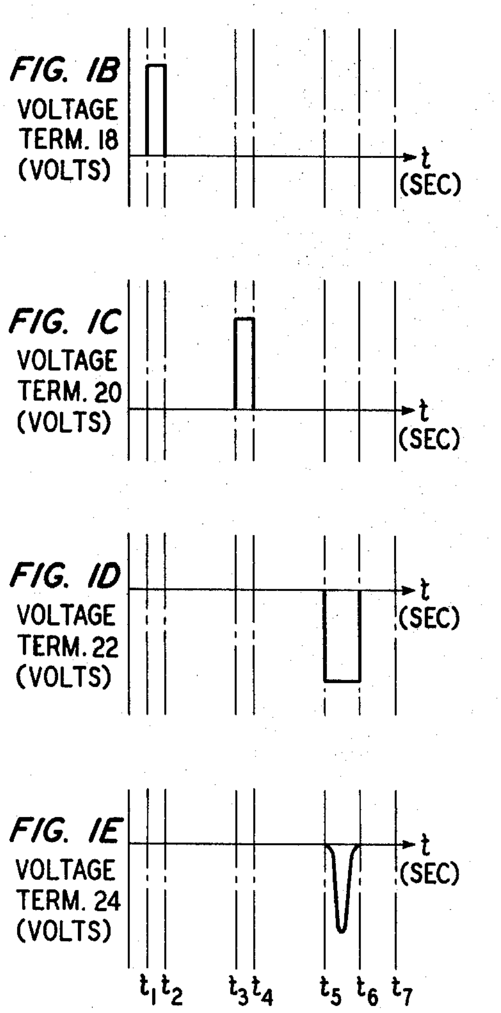
FIGS. 1B, 1C and 1D graphically illustrate the potentials applied to the terminals of the apparatus of FIG. 1A.
FIG. 1E graphically illustrates the output waveform of the apparatus of FIG. 1A as a function of time.

Referring now to FIGS. 1B, 1C and 1D, there are graphically illustrated the various voltage pulses applied to terminals 18, 20 and 22, respectively, as a function of time. FIG. 1E illustrates the output of circuit 10 monitored at terminal 24, as a function of time. The amplitude of the reset voltage pulse of FIG. 1B is typically +10 volts and the reverse-bias breakdown potential of $D_{14}$ is typically −6 volts. The amplitude of the voltage pulse of FIG. 1C is typically +7 volts and the reverse-bias breakdown potential of $D_{16}$ is typically −6 volts. The widths of the voltage pulses of FIG. 1B, 1C and 1D are approximately 5 nanoseconds each.

The time period from $T = t_2$ to $T = t_7$ corresponds to the period of time after the termination of the reset pulse in which charge will remain trapped on $C_{C\text{-}B}$ of transistor 12. During this period of time, which is typically 1 millisecond for this embodiment, the voltage pulses of FIGS. 1C and 1D must be applied to terminals 20 and 22, respectively. If, for example, there were no pulse applied to terminal 20 and the pulse applied to terminal 22 occurred after $T = t_7$, an erroneous pulse would occur because $C_{C\text{-}B}$ would have discharged even though there was no discharge voltage pulse applied to terminal 20.

Figure 2A:
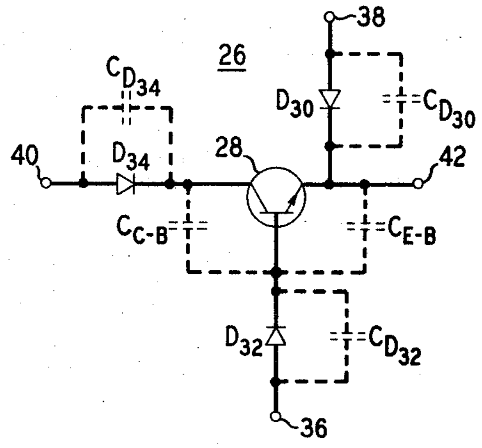
FIG. 2A illustrates a circuit schematic of a preferred embodiment of the invention.

Referring now to FIG. 2A there is illustrated in the preferred circuit embodiment 26 of the invention which comprises an NPN junction transistor 28 and three diodes $D_{30}$, $D_{32}$ and $D_{34}$. The cathodes of $D_{30}$, $D_{32}$ and $D_{34}$ are coupled to the emitter, base and collector of transistor 28, respectively. A terminal 36 is coupled to the anode of $D_{32}$; a terminal 38 is coupled to anode of $D_{30}$; and a terminal 40 is coupled to the anode of $D_{34}$. A terminal 42 is coupled to the emitter of transistor 28.

Dashed line capacitances $C_{D_{30}}$, $C_{D_{32}}$ and $C_{D_{34}}$, represent the parasitic capacitances associated with $D_{30}$, $D_{32}$ and $D_{34}$, respectively. Dashed line capacitances $C_{C\text{-}B}$ and $C_{E\text{-}B}$ represent the parasitic capacitances associated with the collector base and emitter-base junctions of transistor 28. Typically $C_{C\text{-}B}$ is from 5 to 10 picofarads and $C_{E\text{-}B}$, $C_{D\text{-}30}$, $C_{D\text{-}32}$ and $C_{D\text{-}34}$ are all approximately 0.1 picofarads.

During all operations, terminals 36, 38, 40 and 42 are held at ground potential or pulsed to a positive or negative potential. This means that there is no need for any DC voltage sources.

In order to utilize circuit 26 to perform an AND gate function, it is first necessary to apply a negative polarity reset voltage pulse to terminal 36. The amplitude of the reset voltage pulse is sufficient to cause diode 32 to temporarily operate in avalanche breakdown. This causes charge to be inserted into $C_{C\text{-}B}$ that becomes trapped at the termination of the reset pulse due to the fact that $D_{34}$ and the collector-base junction are left reverse-biased.

The reverse-biased diode $D_{34}$ and the collector-base junction act as high impedance paths which, in effect, trap the charge previously inserted into $C_{C\text{-}B}$. The charge trapped on $C_{C\text{-}B}$ will eventually leak off through the reverse-biased junctions since these are not infinitely high impedances. The charge does, however, remain effectually trapped for typically 10 milliseconds.

In order to keep power dissipation relatively low, it is desirable that the reverse bias breakdown potential of a semiconductor junction be relatively low so that a relatively small amplitude voltage pulse can be utilized to cause avalanche breakdown. One of the most common ways to adjust semiconductor junction breakdown potential is to vary the impurity doping concentrations during fabrication of the junction. Unfortunately, leakage through a reverse-biased junction tends to be inversely proportional to the magnitude of the breakdown potential. Therefore, charge trapped on the collector-base capacitance of a transistor will discharge much more slowly into reverse-biased junctions which have relatively high breakdown potentials as compared to those that have relatively low breakdown potentials.

As will be demonstrated during $D_{34}$ and the collector-base junction of transistor 28 are never operated in avalanche breakdown. This means that the respective breakdowns can be relatively high and that therefore leakage through these junctions is relatively low as compared to that through junctions with low breakdown potentials.

Typically the breakdown potential of $D_{34}$ and the collector-base junction of transistor 28 of FIG. 2A is 15 volts as compared to + 6 volts for the breakdown potentials of $D_{30}$ and $D_{32}$ of FIG. 1A which are repeatedly operated in avalanche breakdown. There is at least an order of magnitude of difference in leakage through junctions having a breakdown potential of + 15 volts as compared to + 6 volts. This means in effect that charge trapped on the $C_{C\text{-}B}$ of the transistor 28 of FIG. 2A will leak off 10 times more slowly than charge off $C_{C\text{-}B}$ of the transistor 12 of FIG. 1A.

Typically charge is effectively trapped on $C_{C\text{-}B}$ of transistor 28 of FIG. 2A for 10 milliseconds after the termination of the reset pulse applied to terminal 36. The corresponding time is 1 millisecond for charge trapped on $C_{C\text{-}B}$ of transistor 12 of FIG. 1A.

Returning now to the operation of circuit 26, within 10 milliseconds after the termination of the reset pulse applied to terminal 36, a negative polarity voltage pulse of sufficient amplitude to cause $D_{30}$ to operate in avalanche breakdown is applied to terminal 38. As a result, $D_{32}$ and $D_{34}$ are forward-biased and resulting conduction in transistor 28 causes $C_{C\text{-}B}$ to discharge the charge trapped on it at the termination of the reset pulse.

After the termination of the pulse applied to terminal 38, but within 10 milliseconds of the termination of the reset pulse, a positive polarity voltage pulse is applied to terminal 40. This pulse causes $D_{34}$ and the emitter-base junction of transistor 28 to be forward-biased, thereby producing a pulse of current through transistor 28, which is monitored on terminal 42. Any current pulse through transistor 28 may be easily converted to a voltage pulse by coupling a resistor between terminal 42 and ground potential.

If the positive polarity voltage pulse is applied to terminal 40 within 10 milliseconds of the termination of the reset pulse, and there is no pulse applied to terminal 38 in the time interval between the termination of the reset pulse and the application of the pulse to terminal 40, $D_{34}$ will remain reverse-biased as it is at the termination of the reset pulse. Some current will, however, flow through $C_{D_{34}}$ and transistor 28 and be monitored on terminal 42. The magnitude of the current that does flow is very low since it is limited by $C_{D_{34}}$ which is typically on 0.1 picofarads. This current is typically at least an order of magnitude lower than that which flows when $D_{34}$ is forward-biased.

It is to be noted that circuit 26, when operated as described above, performs an AND gate type function. If, after a reset pulse is applied to terminal 36, pulses are applied to terminals 38 and 40, there is a resulting pulse on terminal 42. If, however, there is an input pulse applied to just terminal 40 after the reset pulse is applied to terminal 36, there is no resulting pulse on terminal 42.

Circuit 26, when operated as described above, can be useful as a switch or a dynamic memory cell. It is useful as a switch which passes a positive polarity voltage pulse if a "close" pulse (i.e., the reset pulse) is applied to terminal 36. It acts as an open circuit if an "open" pulse (i.e., a negative polarity voltage pulse) is applied to terminal 38. It is useful as a dynamic memory cell if the pulse applied to terminal 36 is considered a write "0" pulse, the pulse applied to the terminal 38 is considered a write "1" pulse, and the pulse applied to terminal 40 is considered a read pulse. The appearance or nonappearance of a pulse on terminal 42 is indicative of whether a "1" or a "0" is stored in the memory cell.

Figures 2B, 2C, 2D, 2E:
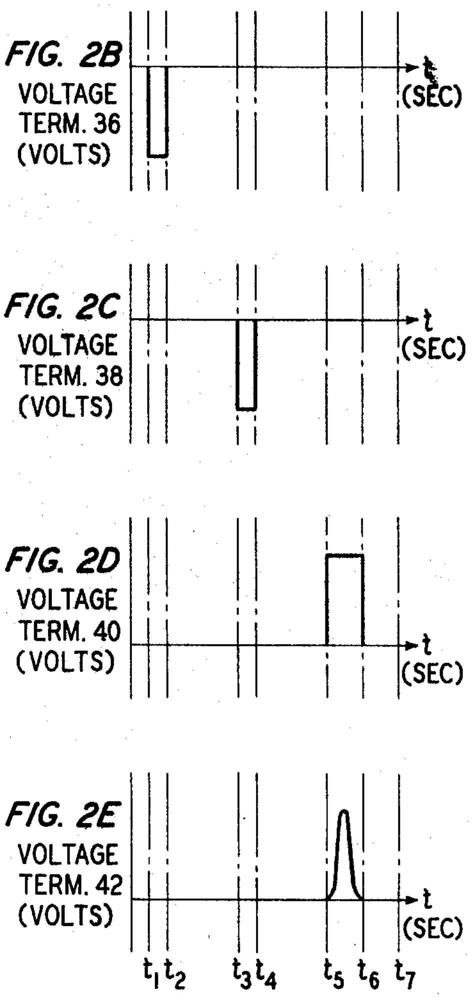
FIGS. 2B, 2C and 2D illustrate the potentials applied to terminals of the apparatus of FIG. 2A as a function of time.
FIG. 2E illustrates the resulting output waveform from the apparatus of FIG. 2A as a function of time.

Referring now to FIGS. 2B, 2C and 2D, there are graphically illustrated the various voltage pulses applied to terminals 36, 38 and 40 respectively, as a function of time.

FIG. 2E illustrates the output of circuit 26, monitored at terminal 42 as a function of time. The amplitude of the voltage pulse of FIG. 2B is −10 volts and the reverse-bias breakdown potential of $D_{32}$ is typically −6 volts. The amplitude of the voltage pulse of FIG. 2C is typically −7 volts and the reverse-bias breakdown of $D_{30}$ is typically −6 volts. The amplitude of the voltage pulse of FIG. 1C is typically +3 volts. The widths of the voltage pulses of FIGS. 2B, 2C and 2D are typically 5 nanoseconds each.

The time period from $T=t_2$ to $T=t_7$ corresponds to the period of time after the termination of the reset pulse in which charge will remain trapped on $C_{C-B}$ of transistor 28. The voltage pulses of FIGS. 2C and 2D must be applied to terminals 38 and 40, respectively within the time period from $T=t_2$ to $T=t_7$, if they are to be applied at all, or there may be an erroneous pulse appearing on terminal 42. If, for example, there is no voltage pulse applied to terminal 38 after the reset pulse is applied to terminal 36 and then at a time greater than $T=t_7$ a pulse is applied to terminal 40, an erroneous pulse would appear on terminal 42 because $C_{C-B}$ of transistor 28 would have discharged even though there was no pulse applied to terminal 38.

Due to the transient operation and the fact that no DC voltages are utilized, the power dissipation of circuit 26 is typically only 3 milliwatts. In addition, the relatively simple structure of circuit 26 allows it to be fabricated in approximately 10 square mils of semiconductor substrate area.

It is to be understood that the embodiments described are merely illustrative of the general principles of the invention. Various modifications are possible consistent with the spirit of the invention. For example, the NPN transistors can be replaced with PNP transistors provided each diode is reversed and voltage pulse polarities are reversed.

What is claimed is:

1. A circuit apparatus comprising:
a junction transistor;
a first diode coupled to the transistor;
a second diode coupled to the transistor;
a first terminal coupled to the first diode;
a second terminal coupled to the second diode;
a third terminal coupled to the emitter of the transistor;
the circuit path between the anode and cathode of the first diode being characterized by a first capacitance;
the circuit path between the anode and cathode of the second diode being characterized by a second capacitance;
the circuit path between the emitter and base of the transistor being characterized by a third capacitance; and
the circuit path between the base and collector of the transistor being characterized by a fourth capacitance, the magnitude of the fourth capacitance being substantially greater than the first, second or third capacitances.

2. The apparatus of claim 1 wherein the junction transistor is an NPN transistor.

3. The apparatus of claim 2 further comprising a fourth terminal coupled to the collector of the transistor.

4. The apparatus of claim 2 wherein:
the anode of the first diode is coupled to the collector of the transistor;
the cathode of the first diode is coupled to the first terminal;
the anode of the second diode is coupled to the base of the transistor; and
the cathode of the second diode is coupled to the second terminal.

5. The apparatus of claim 3 further comprising:
first voltage pulse means coupled to the first terminal for causing the first diode to operate in avalanche breakdown in order to charge the fourth capacitance; and
second voltage pulse means coupled to the second terminal for causing the second diode to operate in avalanche breakdown in order to discharge the fourth capacitance.

6. The apparatus of claim 4 wherein:
the first voltage pulse means is a positive polarity voltage pulse having an amplitude that is greater than the breakdown potential of the first diode; and
the second voltage pulse means is a positive polarity voltage pulse having an amplitude that is sufficient to cause breakdown of the second diode.

7. The apparatus of claim 5 further comprising third voltage pulse means coupled to the emitter of the transistor for causing conduction in the transistor if the fourth capacitance is substantially discharged.

8. The apparatus of claim 6 wherein the third voltage pulse means is a positive polarity voltage pulse having an amplitude that is sufficient to cause the emitter-base junction of the transistor to be forward biased thereby allowing conduction in the transistor if the fourth capacitance is substantially discharged.

9. The apparatus of claim 2 wherein:
the cathode of the first diode is coupled to the base of the transistor;
the anode of the first diode is coupled to the first terminal;
the cathode of the second diode is coupled to the emitter of the transistor; and
the anode of the second diode is coupled to the second terminal.

10. The apparatus of claim 9 further comprising:
a third diode coupled to the transistor;
the circuit path between the anode and cathode of the third diode being characterized by a fifth capacitance, the magnitude of the fifth capacitance being substantially less than the fourth capacitance; and
a fourth terminal coupled to the third diode.

11. The apparatus of claim 10 wherein the anode of the third diode is coupled to the fourth terminal and the cathode of the third diode is coupled to the collector of the transistor.

12. The apparatus of claim 11 further comprising:
first voltage pulse means coupled to the first terminal for causing the first diode to operate in avalanche breakdown in order to charge the fourth capacitance; and
second voltage pulse means coupled to the second terminal for causing the second diode to operate in avalanche breakdown in order to discharge the fourth capacitance.

13. The apparatus of claim 12 wherein:
the first voltage pulse means is a negative polarity voltage pulse having an amplitude that is greater than the breakdown potential of the first diode; and
the second voltage pulse means is a negative polarity voltage pulse having an amplitude that is greater than the breakdown potential of the first diode.

14. The apparatus of claim 13 further comprising:

a third voltage pulse means coupled to the fourth terminal for causing the fourth diode and the emitter-base junction of the transistor to be further biased in order to cause substantial conduction in the transistor if the fourth capacitance is substantially discharged.

15. The apparatus of claim 14 wherein the third voltage pulse means is a negative polarity voltage pulse having an amplitude that is sufficient to forward-bias the third diode if and only if the fourth capacitance is discharged.

* * * * *